US012590361B2

(12) United States Patent
Zhong et al.

(10) Patent No.: US 12,590,361 B2
(45) Date of Patent: Mar. 31, 2026

(54) METHODS AND APPARATUS FOR PROCESSING A SUBSTRATE

(71) Applicant: Applied Materials, Inc., Santa Clara, CA (US)

(72) Inventors: Yaoying Zhong, Singapore (SG); Siew Kit Hoi, Singapore (SG); John Klocke, Kalispell, MT (US); Bridger Earl Hoerner, Columbia Falls, MT (US)

(73) Assignee: Applied Materials Inc., Santa Clara, CA (US)

( * ) Notice: Subject to any disclaimer, the term of this patent is extended or adjusted under 35 U.S.C. 154(b) by 667 days.

(21) Appl. No.: 17/851,620

(22) Filed: Jun. 28, 2022

(65) Prior Publication Data

US 2023/0416906 A1      Dec. 28, 2023

(51) Int. Cl.
| | |
|---|---|
| *H01L 21/66* | (2006.01) |
| *C23C 14/54* | (2006.01) |
| *C23C 16/52* | (2006.01) |
| *G06T 7/00* | (2017.01) |

(52) U.S. Cl.
CPC ............. *C23C 14/54* (2013.01); *C23C 16/52* (2013.01); *G06T 7/0008* (2013.01); *H01L 22/12* (2013.01); *G06T 2207/30148* (2013.01)

(58) Field of Classification Search
None
See application file for complete search history.

(56) References Cited

U.S. PATENT DOCUMENTS

| | | | | |
|---|---|---|---|---|
| 5,980,194 A | * | 11/1999 | Freerks ................... | H01L 21/68 414/754 |
| 5,993,615 A | * | 11/1999 | Abry ....................... | H01J 37/34 118/712 |
| 6,215,897 B1 | * | 4/2001 | Beer ..................... | H01L 21/681 348/87 |
| 6,813,032 B1 | * | 11/2004 | Hunter ................... | G01N 21/94 250/559.22 |
| 7,271,891 B1 | * | 9/2007 | Xiong ............... | H01L 21/67242 356/394 |

(Continued)

FOREIGN PATENT DOCUMENTS

| | | |
|---|---|---|
| KR | 20110089645 A | 8/2011 |
| KR | 10-2022-0062207 A | 5/2022 |

OTHER PUBLICATIONS

EE Times, 'Applied's Tungsten Process Fights Resistance', eetimes. com, pp. 1-3, Jul. 27, 2020 [retrieved on Sep. 11, 2023]. Retrieved from: <URL: https://www.eetimes.com/applieds-tungsten-process-lights-resistance/2> p. 1.

(Continued)

*Primary Examiner* — Jason Lin
(74) *Attorney, Agent, or Firm* — Moser Taboada

(57) ABSTRACT
Methods and apparatus for processing a substrate are provided herein. For example, a method comprises in a process chamber, processing a substrate in a presence of an electric field, subsequently capturing an image of the substrate, determining whether substrate arcing occurred based upon analysis of the captured image, and one of continuing processing of the substrate when no arcing is determined or stopping processing of the substrate when arcing is determined.

19 Claims, 2 Drawing Sheets

(56)            References Cited

U.S. PATENT DOCUMENTS

| | | | | |
|---|---|---|---|---|
| 7,634,365 | B2* | 12/2009 | Steele | G01N 27/002 |
| | | | | 702/35 |
| 10,381,221 | B2 | 8/2019 | Noda et al. | |
| 10,784,134 | B2 | 9/2020 | Peh et al. | |
| 10,957,521 | B2* | 3/2021 | Wang | G06T 7/001 |
| 2002/0094685 | A1* | 7/2002 | Nakata | G01N 21/94 |
| | | | | 438/689 |
| 2008/0132080 | A1 | 6/2008 | Anwar et al. | |
| 2012/0281875 | A1 | 11/2012 | Yasuda et al. | |
| 2015/0276616 | A1 | 10/2015 | Horn | |
| 2015/0311129 | A1* | 10/2015 | Miller | H01L 21/3065 |
| | | | | 156/345.25 |
| 2017/0024880 | A1* | 1/2017 | Peng | G06V 10/255 |
| 2017/0162370 | A1* | 6/2017 | Zhang | H01J 37/32944 |
| 2018/0040460 | A1* | 2/2018 | Gottscho | H01J 37/32935 |
| 2020/0043764 | A1* | 2/2020 | Clark | H01L 22/12 |
| 2020/0200606 | A1* | 6/2020 | Yurt | G01J 3/06 |
| 2020/0371046 | A1* | 11/2020 | Wang | G01N 21/9505 |
| 2020/0393242 | A1* | 12/2020 | Vishwanath | H01L 21/68742 |
| 2021/0265170 | A1 | 8/2021 | Watanabe et al. | |
| 2021/0305074 | A1* | 9/2021 | Wang | H01J 37/32944 |
| 2022/0333248 | A1* | 10/2022 | Choi | G06T 7/174 |

OTHER PUBLICATIONS

International Search Report for PCT/US2023/024402, dated Sep. 19, 2023.

* cited by examiner

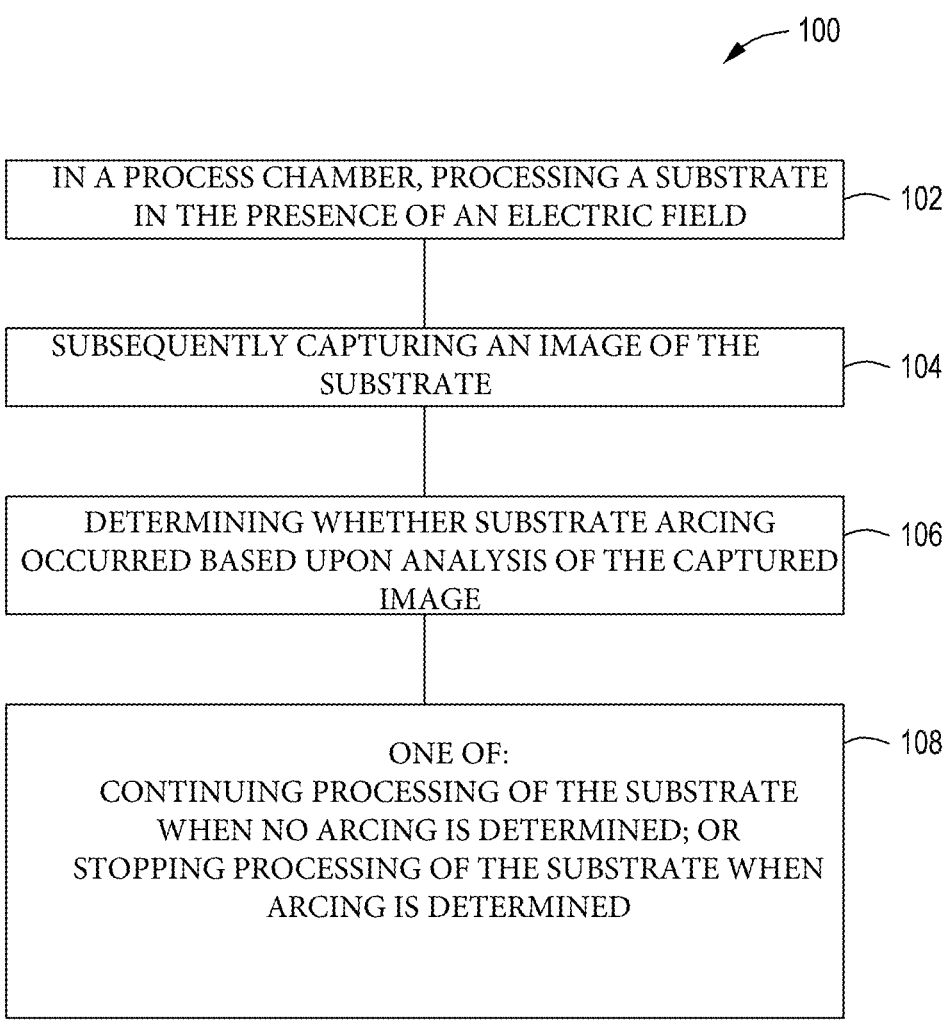

~ 100

IN A PROCESS CHAMBER, PROCESSING A SUBSTRATE
IN THE PRESENCE OF AN ELECTRIC FIELD       ~ 102

SUBSEQUENTLY CAPTURING AN IMAGE OF THE
SUBSTRATE       ~ 104

DETERMINING WHETHER SUBSTRATE ARCING
OCCURRED BASED UPON ANALYSIS OF THE CAPTURED
IMAGE       ~ 106

ONE OF:
CONTINUING PROCESSING OF THE SUBSTRATE
WHEN NO ARCING IS DETERMINED; OR
STOPPING PROCESSING OF THE SUBSTRATE WHEN
ARCING IS DETERMINED       ~ 108

FIG. 1

METHODS AND APPARATUS FOR PROCESSING A SUBSTRATE

FIELD

Embodiments of the present disclosure generally relate to methods and apparatus for processing a substrate, and for example, to methods and apparatus that use real-time arcing detection.

BACKGROUND

Substrate level (wafer) arcing can be a serious problem in high volume production (deposition. For example, once arcing occurs, there can be up to a 100% yield drop, due to continued substrate level arcing in a processing chamber. Current approaches for substrate level arcing detection (e.g., voltage & arc-count detection) can be somewhat limiting in that such approaches are not very accurate and are not performed in real-time (e.g., arcing is usually observed after one or more processes have been performed), which can lead to substrate scrap (arcing occurring to other substrates) and decreased throughput.

Therefore, the inventors describe herein improved methods and apparatus for real-time arcing for processed substrates.

SUMMARY

Methods and apparatus for processing a substrate are provided herein. In some embodiments, a method for processing a substrate includes in a process chamber, processing a substrate in a presence of an electric field, subsequently capturing an image of the substrate, determining whether substrate arcing occurred based upon analysis of the captured image and one of continuing processing of the substrate when no arcing is determined or stopping processing of the substrate when arcing is determined.

In accordance with at least some embodiments, a non-transitory computer readable storage medium has instructions stored thereon that when executed by a processor perform a method for processing a substrate includes in a process chamber, processing a substrate in a presence of an electric field, subsequently capturing an image of the substrate, determining whether substrate arcing occurred based upon analysis of the captured image and one of continuing processing of the substrate when no arcing is determined or stopping processing of the substrate when arcing is determined.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 1 is a flowchart of a method for processing a substrate, in accordance with at least some embodiments of the present disclosure.

Figure 2:
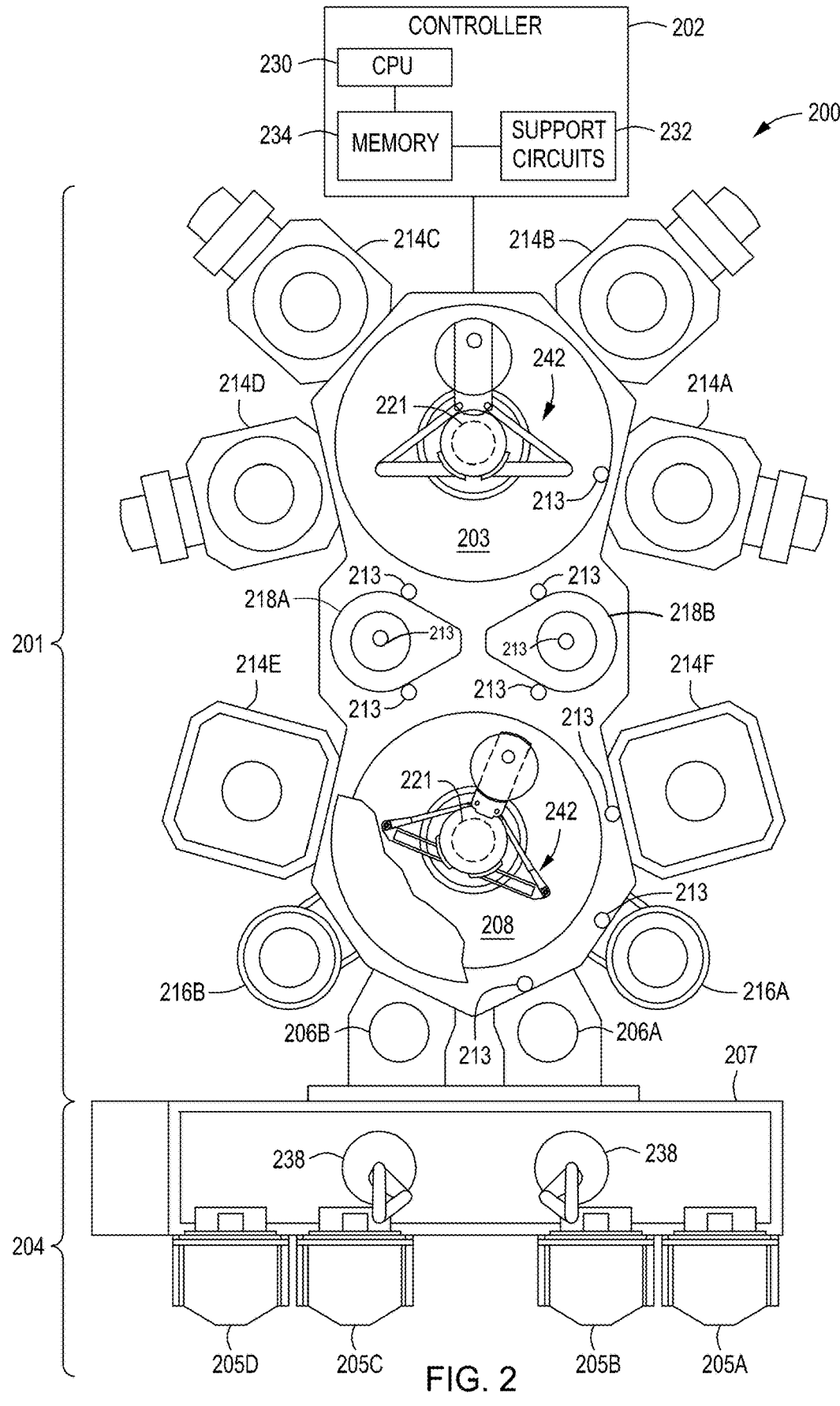
FIG. 2 is a diagram of an apparatus for performing the method of FIG. 1, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a methods and apparatus for processing a substrate are provided herein. For example, the methods and apparatus described herein use real-time arcing detection. In at least some embodiments, a method for processing a substrate can comprise processing a substrate in a presence of an electric field, subsequently capturing an image of the substrate, determining whether substrate arcing occurred based upon analysis of the captured image and continuing processing of the substrate when no arcing is determined or stopping processing of the substrate when arcing is determined. When compared to conventional methods and apparatus, the methods and apparatus described herein can decrease, if not eliminate, substrate scrap (waste), e.g., preventing other substrates from being processed in a comprised (issued) chamber, and can increase throughput.

FIG. 1 is a flowchart of a method 100 for processing a substrate, and FIG. 2 is a tool 200 (or apparatus) that can used for carrying out the method 100, in accordance with at least some embodiments of the present disclosure. Methods and apparatus described herein use one or more cameras or sensors that are positioned (installed) near a slit valve (and/or one or more modules) of a processing chamber/platform (e.g., an integrated tool), which allows real-time arc detection, e.g., once substrate arcing occurs from a specific process chamber). Similarly, the camera or sensors can also be installed above one or more process chambers that have a transparent cover, thus allowing the whole substrate to be observed from an outside of the process chamber and above the process chamber cover. In at least some embodiments, after a substrate is processed in one or more of the processing chambers of the tool 200 and transferred through the slit valve (and/or one or more modules) to another processing chamber for further processing, the one or more cameras or sensors are configured to provide an image (or photo) of the substrate to a processor of the tool 200. The processor compares (e.g., using a control algorithm, artificial intelligence, etc.) the image to a baseline (or look-up table), which can comprise one or more substrate arcing patterns. If the processor determines that the image matches the one or more substrate arcing patterns, the processor can provide an indication of a fault and can immediately stop the processing sequence. Alternatively or additionally, if the processor determines that the image does not match the one or more substrate arcing patterns, the processor can continue processing of the substrate in accordance with a recipe.

The method 100 may be performed in the tool 200 which can include any suitable process chambers configured for one or more of physical vapor deposition (PVD), chemical vapor deposition (CVD) and/or atomic layer deposition (ALD), such as plasma enhanced ALD or thermal ALD (e.g., no plasma formation). Examples of processing systems that may be used to perform the inventive methods disclosed herein may include, but are not limited to, the one or more process chambers commercially available from Applied Materials, Inc., of Santa Clara, California. Other process chambers, including those from other manufacturers, may also be suitably used in connection with the teachings provided herein.

The tool 200 can be embodied in individual process chambers that may be provided in a standalone configuration or as part of a cluster tool, for example, an integrated tool (the tool 200) described below with respect to FIG. 2. Examples of the integrated tool can include, but are not limited to, the one or more process chambers commercially available from Applied Materials, Inc., of Santa Clara, California. The methods described herein may be practiced using other cluster tools having suitable process chambers coupled thereto, or in other suitable process chambers. For example, in some embodiments, the inventive methods discussed above may be performed in an integrated tool such that there are limited or no vacuum breaks between processing steps. For example, reduced vacuum breaks may limit or prevent contamination (e.g., oxidation) of one or more metal layers or other portions of the substrate.

The integrated tool includes a vacuum-tight processing platform (processing platform 201), a factory interface 204, and a controller 202. The processing platform 201 comprises multiple process chambers, such as 214A, 214B, 214C, and 214D operatively coupled to a transfer chamber 203 (vacuum substrate transfer chamber) and process chambers 214E and 214F operatively coupled to a buffer chamber 208 (vacuum substrate buffer chamber).

The factory interface 204 is operatively coupled to the buffer chamber 208 by one or more load lock chambers (two load lock chambers, such 206A and 206B shown in FIG. 2). In at least some embodiments, one of the buffer chamber 208 or the transfer chamber 203 of the tool 200 can omitted. One or more modules or channels can be provided between the buffer chamber 208 and the transfer chamber 203 and can be configured to receive one or more substrates from the buffer chamber 208 and/or the transfer chamber 203. In at least some embodiments, a module 218A and a module 218B are provided between the buffer chamber 208 and the transfer chamber 203 and are configured to receive one or more substrates from the buffer chamber 208 and/or the transfer chamber 203 during operation, as will be described in greater detail below. As noted above, the module 218A and a module 218B can have transparent cover.

In some embodiments, the factory interface 204 comprises a docking station 207, a factory interface robot 238 to facilitate the transfer of one or more semiconductor substrates (wafers). The docking station 207 is configured to accept one or more front opening unified pod (FOUP). Four FOUPS, such as 205A, 205B, 205C, and 205D are shown in the embodiment of FIG. 2. The factory interface robot 238 is configured to transfer the substrates from the factory interface 204 to the processing platform 201 through the load lock chambers, such as 206A and 206B. Each of the load lock chambers 206A and 206B have a first port coupled to the factory interface 204 and a second port coupled to the transfer chamber 203. The load lock chambers 206A and 206B are coupled to a pressure control system (not shown) which pumps down and vents the load lock chambers 206A and 206B to facilitate passing the substrates between the vacuum environment of the buffer chamber 208 and the substantially ambient (e.g., atmospheric) environment of the factory interface 204. In at least some embodiments, the buffer chamber 208 can be maintained at a substantially ambient environment. In embodiments when the buffer chamber 208 is not used, the load lock chambers 206A and 206B facilitate passing the substrates between the transfer chamber 203 and the factory interface 204. The buffer chamber 208 and the transfer chamber 203 each have a vacuum robot 242 positioned to transfer/receive one or more substrates. For example, the vacuum robot 242 of the buffer chamber 208 is capable of receiving/transferring the substrates 221 between the load lock chambers 206A and 206B, the process chambers 214E and 214F, and the modules 218A and 218F. Similarly, the vacuum robot 242 of the transfer chamber 203 is capable of receiving/transferring the substrates 221 between the process chambers 214A, 214B, 214C, and 214D and the modules 218A and 218F.

In some embodiments, the process chambers 214A, 214B, 214C, 214D, 214E, and 214F can comprise at least an ALD chamber, a CVD chamber, a PVD chamber, an e-beam deposition chamber, and/or an electroplating, electroless (EEP) deposition chamber. Likewise, in some embodiments, one or more optional service chambers (shown as 216A and 216B) may be coupled to the buffer chamber 208. The service chambers 216A and 216B may be configured to perform other substrate processes, such as degassing, bonding, chemical mechanical polishing (CMP), substrate cleaning (preclean), wafer cleaving, etching, plasma dicing, orientation, substrate metrology, cool down, and the like.

In at least some embodiments, one or more apparatus 213 can be installed, using one or more suitable installment devices (e.g., nuts, bolts, adhesives, bonds, etc.) adjacent to the process chambers 214A, 214B, 214C, 214D, 214E, and 214F the service chambers 216A and 216B, the modules 218A and 218F, and/or the load lock chambers 206A and 206B. For example, the one or more apparatus 213 can be a camera, a sensor (e.g., a charge-couple device), or other suitable apparatus capable of capturing an image or photo, as will be described in greater detail below. Additionally, the one or more apparatus 213 can be installed adjacent to an opening leading to any of the process chambers 214A, 214B, 214C, 214D, 214E, and 214F the service chambers 216A and 216B, the modules 218A and 218F, and/or the load lock chambers 206A and 206B. For example, in at least some embodiments, the one or more apparatus 213 can be installed adjacent to a slit-valve (not shown) that opens to the 214A, 214B, 214C, 214D, 214E, and 214F the service chambers 216A and 216B, the modules 218A and 218F, and/or the load lock chambers 206A and 206B.

The controller 202 controls the operation of the tool 200 using a direct control of the process chambers 214A, 214B, 214C, 214D, 214E, and 214F, and the apparatus 212, or alternatively, by controlling the computers (or controllers) associated with the process chambers 214A, 214B, 214C, 214D, 214E, and 214F, the apparatus 212, and the tool 200. In operation, the controller 202 enables data collection and feedback from the respective chambers and systems to optimize performance of the tool 200. The controller 202 generally includes a central processing unit 230, a memory 234, and a support circuit 232. The central processing unit 230 may be any form of a general-purpose computer processor that can be used in an industrial setting. The support circuit 232 is conventionally coupled to the central processing unit 230 and may comprise a cache, clock circuits, input/output subsystems, power supplies, and the like. Software routines, such as processing methods as described above may be stored in the memory 234 (e.g., non-transitory computer readable storage medium) and, when executed by the central processing unit 230, transform the central processing unit 230 into a specific purpose computer (e.g., the controller 202). The software routines may also be stored and/or executed by a second controller (not shown) that is located remotely from the tool 200.

Continuing with reference to FIG. 1, initially one or more substrates, thermal modular assembly, or the like may be loaded into one or more of the Four FOUPS, such as 205A, 205B, 205C, and 205D (FIG. 2). For example, in at least some embodiments, a substrate 221 (wafer) can be loaded into FOUP 205B. The substrate 300 can have a diameter of 150 mm, 200 mm, 300 mm, etc. The substrate 221 can be formed from germanium, silicon, silicon carbide, silicon oxide, etc. In at least some embodiments, the substrate 221 can have a 300 mm diameter and can formed from silicon. In at least some embodiments, one or more metal layers can be deposited on the substrate 221. For example, the one or more metal layers can comprise aluminum, cobalt, copper, nitride, titanium, tantalum, etc. In at least some embodiments, the substrate 221 can comprise a metal layer comprising cobalt and tungsten.

Once loaded, the factory interface robot 238 can transfer the substrate 221 from the factory interface 204 to the processing platform 201 through, for example, the load lock chamber 206A. The vacuum robot 242 can transfer the substrate 221 from the load lock chamber 206A to and from one or more of the process chambers 214A, 214B, 214C, 214D, 214E, and 214F and/or the service chambers 216A and 216B.

For example, in at least some embodiments, the vacuum robot 242 can transfer the substrate 221 from the load lock chamber 206A to the service chamber 216A where one or more of degassing, bonding, chemical mechanical polishing (CMP), substrate cleaning (preclean), wafer cleaving, etching, plasma dicing, orientation, substrate metrology, cool down can be performed. For example, in at least some embodiments, a precleaning process can be performed on the substrate 221 to remove oxide that may have formed on the metal layer. In at least some embodiments, prior to or after processing in the substrate 221 in the service chamber 216A, the one or more apparatus 213 can be used to capture an image (photo) of the substrate 221, as will be described in greater detail below.

Next, the vacuum robot 242 of the buffer chamber 208 can transfer the substrate 221 from the service chamber 216A to one of the modules 218A and 218B (e.g., for cool down). Again, prior to or after transferring the substrate 221 to the modules 218A and 218B, the one or more apparatus 213 can be used to capture an image (photo) of the substrate 221, as will be described in greater detail below.

Next, at 102, the method 100 comprises in a process chamber, processing a substrate in a presence of an electric field. For example, the vacuum robot 242 of the transfer chamber 203 can transfer the substrate 221 from one of the modules 218A and 218B to one of the process chambers 214A, 214B, 214C, and 214D where one or more deposition processes may be performed on the substrate 221. In at least some embodiments, the substrate 221 can be transferred to the process chamber 214A where physical vapor deposition can be performed on the substrate 221. For example, during physical vapor deposition one or more additional metal layers (e.g., a relatively thick, highly uniform, low-temperature film comprising at least one of aluminum nitride, aluminum oxide, gallium arsenide, germanium, indium tin oxide, lead zirconium titanate, scandium doped aluminum nitride, silicon carbide, etc.) may be deposited on the metal layer previously deposited on the substrate 221. The additional metal layers can be used for one or more MTM (More than Moore) applications, such as power devices, MEMS, RF, photonics, and packaging technologies, e.g., TSV.

Next, at 104, the method 100 comprises subsequently capturing an image of the substrate. For example, as noted above, one or more apparatus can used to capture an image of the substrate 221. For example, the one or more apparatus 213 can capture an image of the substrate 221 after the deposition process. For example, as noted above, in view of the electric field that is present during a deposition process (e.g., physical vapor deposition or chemical vapor deposition), arcing may occur during physical vapor deposition. Accordingly, after the deposition process, under control of the controller 202, the one or more apparatus 213 can capture an image of a top surface of the substrate (e.g., the deposited additional metal layer). The captured image can be transmitted to the controller 202, via wired or wireless communication, and stored in the memory 234.

Next, at 106, the method 100 comprises determining whether substrate arcing occurred based upon analysis of the captured image. For example, in at least some embodiments, the controller 202 can compare the captured image (image processing) with the stored substrate. For example, the controller 202 can compare the captured image to at least one of a baseline (model, e.g., shape data) or a look-up table. For example, the baseline can comprise a corresponding image (arcing wafer pattern) of a maximum (predetermined) amount of acceptable arcing that is stored in the memory 234. For example, the arcing wave pattern can comprise shape data on the surface (e.g., along or adjacent to a periphery of the substrate or adjacent to a center of the substrate, or any other area of the substrate). Thus, the controller 202 can compare the captured image with the baseline to determine if an occurrence of arcing equals or exceeds the maximum (predetermined) amount of acceptable arcing. Likewise, the controller 202 can compare the captured image with images (a plurality of arcing wafer patterns) stored in the memory 234 to determine if an occurrence of arcing equals or exceeds the maximum (predetermined) amount of acceptable arcing.

Next, at 108, the method 100 comprises one of continuing processing of the substrate when no arcing is determined or stopping processing of the substrate when arcing is determined. For example, if the controller 202 determines that the captured image substantially matches (equals) the stored image of the baseline and/or the stored images in the look-up table, the controller 202 can continue processing of the substrate 221 using one or more of the process chambers 214A, 214B, 214C, 214D, 214E, and 214F and/or the service chambers 216A and 216B. Conversely, if the controller 202 determines that the captured image does not substantially match (equal) the stored image of the baseline and/or the stored images in the look-up table, the controller 202 can stop processing of the substrate 221. Additionally, the method 100 can comprise triggering a fault indication when arcing is determined. In at least some embodiments, the controller 202 can trigger a fault indication (e.g., alarm, visual alert, etc.) and transmit the fault indication to a user.

The method 100 comprising operations 102-108 can be repeated for each of the process chambers 214A, 214B, 214C, 214D, 214E, and 214F and/or the service chambers 216A and 216B. The method 100 comprising operations 102-108 can also be used in a similar manner in conjunction with the modules 218A and 218F and/or the load lock chambers 206A and 206B, e.g., metrology.

While the foregoing is directed to embodiments of the present disclosure, other and further embodiments of the disclosure may be devised without departing from the basic scope thereof.

The invention claimed is:

1. A method for processing a substrate, comprising:

in a process chamber, processing a substrate in a presence of an electric field;

subsequently capturing an image of the substrate, wherein capturing the image of the substrate is performed adjacent a slit valve of a deposition chamber configured for processing the substrate;

comparing the captured image to a baseline image of a substrate arcing pattern of a maximum amount of acceptable arcing;

determining that substrate arcing occurred and is less than the maximum amount of acceptable arcing based upon the comparison of the captured image; and continuing processing of the substrate when arcing is determined to be less than the maximum amount of acceptable arcing.

2. The method of claim 1, wherein capturing the image of the substrate is performed at a module disposed adjacent to a transfer chamber.

3. The method of claim 1, wherein capturing the image of the substrate is performed using at least one of a camera or a sensor.

4. The method of claim 1, wherein processing the substrate comprises a deposition process that is at least one of a physical vapor deposition process or a chemical vapor deposition process.

5. The method of claim 1, further comprising triggering a fault indication when arcing is determined.

6. The method of claim 1, wherein the substrate is made from at least one of aluminum, copper, or tantalum.

7. The method of claim 1, comprising stopping processing of the substrate when arcing is determined to be equal to or greater than the maximum amount of acceptable arcing.

8. A non-transitory computer readable storage medium having instructions stored thereon that when executed by a processor perform a method for processing a substrate, comprising:

in a process chamber, processing a substrate in a presence of an electric field;

subsequently capturing an image of the substrate, wherein capturing the image of the substrate is performed adjacent a slit valve of a deposition chamber configured for processing the substrate;

comparing the captured image to a baseline image of a substrate arcing pattern of a maximum amount of acceptable arcing;

determining that substrate arcing occurred and is less than the maximum amount of acceptable arcing based upon analysis the comparison of the captured image; and continuing processing of the substrate when arcing is determined to be less than the maximum amount of acceptable arcing.

9. The non-transitory computer readable storage medium of claim 8, wherein capturing the image of the substrate is performed at a module disposed adjacent to a transfer chamber.

10. The non-transitory computer readable storage medium of claim 8, wherein capturing the image of the substrate is performed using at least one of a camera or a sensor.

11. The non-transitory computer readable storage medium of claim 8, wherein processing the substrate comprises a deposition process that is at least one of a physical vapor deposition process or a chemical vapor deposition process.

12. The non-transitory computer readable storage medium of claim 8, further comprising triggering a fault indication when arcing is determined.

13. The non-transitory computer readable storage medium of claim 8, wherein the substrate is made from at least one of aluminum, copper, or tantalum.

14. The non-transitory computer readable storage medium of claim 8, wherein the method comprises stopping processing of the substrate when arcing is determined to be equal to or greater than the maximum amount of acceptable arcing.

15. An apparatus for processing a substrate, comprising:

a process chamber configured to process a substrate in a presence of an electric field;

an apparatus for capturing an image of the substrate, wherein capturing the image of the substrate is performed adjacent a slit valve of a deposition chamber configured for processing the substrate, wherein the apparatus for capturing the image of the substrate is at least one of a camera or a sensor; and a controller configured to:

compare the captured image to a baseline image of a substrate arcing pattern of a maximum amount of acceptable arcing;

determine that substrate arcing occurred and is less than the maximum amount of acceptable arcing based upon the comparison of the captured image; and continue to process the substrate when no arcing is determined arcing is determined to be less than the maximum amount of acceptable arcing.

16. The apparatus of claim 15, wherein the image of the substrate is captured at a module disposed adjacent to a transfer chamber of the apparatus.

17. The apparatus of claim 15, wherein the process chamber is at least one of a physical vapor deposition process or a chemical vapor deposition process.

18. The apparatus of claim 15, wherein the controller is further configured to trigger a fault indication when arcing is detected.

19. The apparatus of claim 15, wherein the controller is configured to stop processing of the substrate when arcing is determined to be equal to or greater than the maximum amount of acceptable arcing.

* * * * *